United States Patent
Chao et al.

(10) Patent No.: US 6,519,749 B1
(45) Date of Patent: Feb. 11, 2003

(54) INTEGRATED CIRCUIT PARTITIONING PLACEMENT AND ROUTING SYSTEM

(75) Inventors: Ping Chao, Los Altos Hills, CA (US); Wei-Jin Dai, Cupertino, CA (US); Mitsuru Igusa, Los Gatos, CA (US); Wei-Lun Kao, Cupertino, CA (US); Jia-Jye Shen, Palo Alto, CA (US)

(73) Assignee: Silicon Perspective Corporation, San Jose, CA (US)

( * ) Notice: Subject to any disclaimer, the term of this patent is extended or adjusted under 35 U.S.C. 154(b) by 0 days.

(21) Appl. No.: 09/573,996

(22) Filed: May 17, 2000

Related U.S. Application Data

(63) Continuation-in-part of application No. 09/005,361, filed on Jan. 9, 1998, now Pat. No. 6,249,902.

(51) Int. Cl.[7] ............................. G06F 17/50; G06F 9/45
(52) U.S. Cl. ................................. 716/9; 716/8; 716/10
(58) Field of Search ................................ 716/9, 8, 10

(56) References Cited

U.S. PATENT DOCUMENTS

| | | | | |
|---|---|---|---|---|
| 4,918,614 A | * | 4/1990 | Modarres et al. | 716/10 |
| 5,311,443 A | * | 5/1994 | Crain et al. | 716/10 |
| 5,838,583 A | * | 11/1998 | Varadarajan et al. | 716/9 |
| 5,898,597 A | * | 4/1999 | Scepanovic et al. | 716/9 |
| 5,971,588 A | * | 10/1999 | Scepanovic et al. | 700/121 |
| 6,145,117 A | * | 11/2000 | Eng | 716/18 |
| 6,170,080 B1 | * | 1/2001 | Ginetti et al. | 716/18 |
| 6,253,363 B1 | * | 6/2001 | Gasanov et al. | 716/12 |
| 6,256,768 B1 | * | 7/2001 | Igusa | 716/11 |
| 6,289,495 B1 | * | 9/2001 | Raspopovic et al. | 716/12 |
| 6,292,929 B2 | * | 9/2001 | Scepanovic et al. | 716/14 |

* cited by examiner

Primary Examiner—Vuthe Siek
Assistant Examiner—A. M. Thompson
(74) Attorney, Agent, or Firm—Daniel J. Bedell; Smith-Hill and Bedell

(57) ABSTRACT

Disclosed herein is a method for dividing an integrated circuit (IC) design into several circuit partitions, each including one or more circuit modules, and then separately carrying out placement and routing for each circuit partition, with each partition being implemented within a separate area of an IC substrate. The method initially generates a whole-chip trial placement that tends to cluster cells of each circuit module together. An IC substrate floor plan assigning modules to various partitions is prepared, with the size, shape and relative position of each partition being determined by size, shape and relative position of areas of the substrate occupied by those modules in the trial floor plan. A trial routing is also performed with information on which to base a pin assignment plan for each module. A detailed placement and routing process is then independently performed for each partition, with placement and routing of cells within each partition constrained by the floor plan and pin assignment plan.

23 Claims, 6 Drawing Sheets

INTEGRATED CIRCUIT PARTITIONING PLACEMENT AND ROUTING SYSTEM

CROSS-REFERENCE TO RELATED APPLICATIONS

Figure 1:
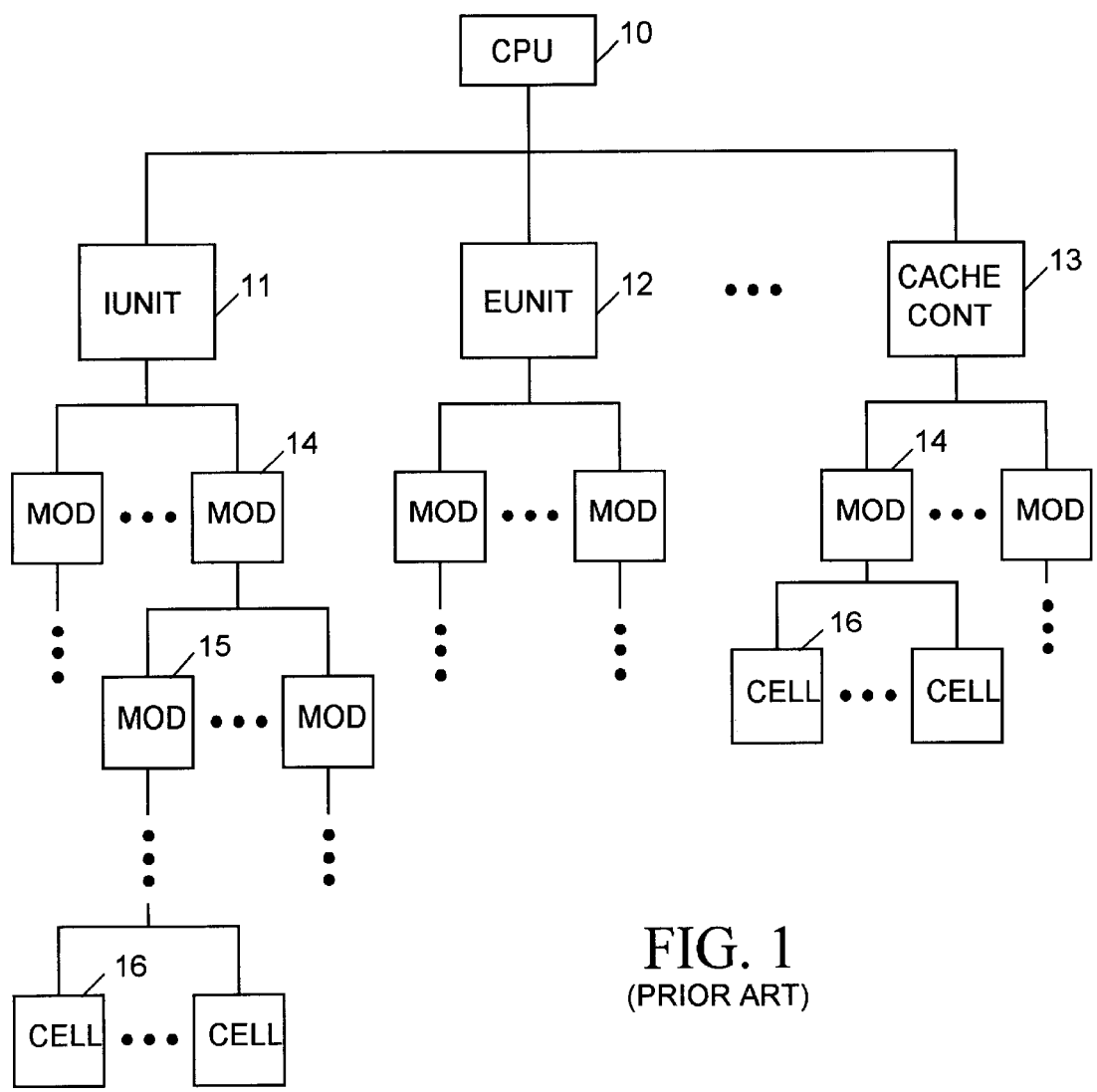

The present application is a continuation-in-part application of U.S. patent application Ser. No. 09/005,361 filed Jan. 9, 1998, now U.S. Pat. No. 6,249,902 issued Jun. 19, 2001, incorporated herein by reference.

BACKGROUND OF THE INVENTION

1. Field of the Invention

The invention relates to methods for designing integrated circuits, and particularly to a system for determining the physical placement and interconnection of components forming an integrated circuit.

2. Description of Related Art

An IC design engineer typically models a circuit using a hardware description language (HDL) to describe the behavior of the various components making up a circuit and the manner in which those components are interconnected. The design engineer then programs a circuit simulator to simulate circuit behavior based on the HDL circuit model. Since the HDL model is a relatively high level behavioral model of the circuit, the initial circuit simulation does not take into account the timing and other constraints of the semiconductor technology that will implement the IC, After verifying circuit logic, the design engineer usually employs computer-aided design and engineering tools to convert the high-level HDL circuit model into a lower-level, technology specific, circuit model, such as a netlist. In this model the circuit components are defined in terms of models of physical circuit cells (logic gates, transistors, etc.) that will eventually implement the components in the IC. The design engineer may then use a simulator to again simulate circuit operation based on the netlist model to verify circuit logic. Since the netlist model is more closely related to the eventual physical realization of the IC, the simulator or special timing verification tools can verify circuit timing. However timing verification at this stage of the design is still not entirely accurate since the netlist model does not take into account the actual physical layout on an IC chip of the cells that will form the circuit. Having verified the logic and at least partially verified timing of the netlist circuit model, the design engineer is ready to begin designing the physical layout and interconnection of circuit cells on the IC with the aid of computer-aided placement and routing tools.

Placement and routing is typically an iterative process. After establishing a trial placement of cells in the substrate area, the system generates a trial routing for the placement. A trial routing does not determine actual signal path routes between cells but makes an estimate as to whether there is sufficient space available in the substrate area to route the signal paths and estimates the length and impedance characteristics of those paths that affect the time required for signals to travel over the paths. If a suitable trial routing path cannot be established for the trial placement, the trial placement may be modified, and a new trial routing is attempted. The process can be repeated iteratively until suitable placement and trial routing is obtained. At this point the physical design is typically converted back into an HDL model that takes into account not only the nature of the semiconductor technology implementing the IC but also the signal timing influences of the placement and trial routing. Simulation and timing verification tools are then employed to verify circuit logic and timing. Thereafter the design engineer uses routing tools to develop a detailed routing for the IC defining the specific paths interconnecting the circuit cells. The placement and detailed routing can then be converted into HDL format and again subjected logic and timing verification. Thereafter the detailed placement and routing specification provide a basis for defining masks for fabricating the IC.

Divide-and-Conquer Placement Systems

Some placement algorithms employ a "divide-and-conquer" approach to circuit placement which successively subdivides the substrate area of an IC into smaller and smaller areas. Whenever an area is subdivided into two (or more) smaller areas, the algorithm looks for a way to allocate cells of the original area among the smaller areas in a way that minimizes the number of signal paths crossing partition lines. This tends to cluster interconnected cells together, thereby reducing the time signals need to travel between cells. Since there are usually a huge number of possible cell allocations that can be made after each successive partitioning, such placement systems normally use various search techniques to try to find a most suitable placement allocation. For example a system may initially randomly allocate cells and then move individual cells from partition to partition in hopes of finding a better placement.

Design Partitioning

The HDL and netlist models are typically hierarchical in nature in that the circuit is defined by several interconnected modules, each of which in turn may be defined by several by lower level modules. Each module typically has some identifiable logical function. For example a design for a microprocessor may include top level modules such as an instruction processor module, a cache controller module, and a clock controller module. The instruction processor module may be formed, for example, by an instruction decoder module, an arithmetic logic unit module, etc. The instruction decoder module may in turn be formed by a number of logic gate modules, each of which is defined at the lowest level of the design hierarchy by a set low-level cells such as transistors or logic gates.

One undesirable effect of a divide-and-conquer placement algorithm is that it discards the hierarchical nature of the design and does not place the cells of any module in a well-defined area of an IC. Cells of closely interconnected modules are usually intermingled to minimize signal path lengths. This makes it impossible for the designer to substantially modify a logic module within an IC design without repeating the placement and routing process for the entire IC. Design engineers therefore often like to "partition" an IC design along modular lines and place each partition in an identifiable area of the IC substrate. A designer will also place various "standard" cells in separately identifiable boxes ("hard fence areas") that are not altered during the placement and routing process. IC designers also like to partition a large IC design along modular lines so each partition can be separately placed and routed by several concurrently operating placement and routing systems. This speeds up the placement and routing process.

In order to partition a design, the design engineer initially develops a "floor plan" of the IC indicating the size, shape and relative position of each partition, along with a "pin assignment" plan defining points (pins) wherein signals cross partition boundaries. The floor plan may also define any hard fence areas included within each partition. The design engineer then develops a separate specification for each partition so that placement and routing can proceed independently for each partition consistent with the floor and pin assignment plans.

When developing a floor plan for partitioning an IC, the design engineer can usually roughly estimate the size of each partition based on information contained in the netlist including the number and sizes of transistors and other components that form the modules to be included in the partition. However since the design engineer often does not have as much information on which to base the choice of partition shape, position and pin assignments, the initial shape, position and pin assignments for each partition are often based on little more than "educated guesses".

Since floor and pin assignment plans developed in such manner often do not directly lead to placement and routing plans satisfying circuit criteria, a design engineer may have to iteratively modify the floor and pin assignment plans several times before arriving at plans that permit satisfactory placement and routing. This labor intensive iterative process can be slow to converge to an acceptable IC layout, and the final layout my be less than optimal in many respects.

What is needed is an IC placement and routing system that automatically produces initial floor and pin assignment plans that can lead to optimal placement and routing of circuit components.

SUMMARY OF THE INVENTION

The present invention relates to a system for placing and routing an integrated circuit (IC) designed as a hierarchy of circuit modules. The invention is used when the circuit design is to be partitioned along modular lines, with each partition being placed in a separate, identifiable area of an IC substrate.

In accordance with one aspect of the invention, the system performs an initial "full-chip" divide-and-conquer trial placement and routing of the entire IC design in a manner that does not take into account the manner in which the circuit is to be partitioned but which is biased toward clustering of cells of each given module together. The system then creates a floor plan for the IC that establishes the size and shape and an initial positioning of areas of IC substrate that are to contain the modules forming each partition. The size, shape and position of each partition defined by floor plan is based on the actual size, shape and relative positions of areas of the trial placement that contain those modules.

In accordance with another aspect of the invention, the system also creates a pin assignment plan for each partition based on the trial placement and routing plans.

In accordance with a further aspect of the invention, the system treats each of the partitions as a separate IC design and separately optimizes cell placement and routing within each partition. The system also optimizes "top level" positioning of the partitions themselves within the IC substrate and routing therebetween without changing the size or shape of the partitions or their pin assignments.

Since the size, shape, pin assignments and initial positioning of each partition are based on a whole-chip trial placement and routing, the system typically produces floor and pin assignment plans that quickly converge to an acceptable placement and routing plan that makes efficient use of IC substrate space.

It is accordingly an object of the invention to provide a placement and routing system that automatically produces initial floor and pin assignment plans that determines the appropriate size, shape, positions of circuit partitions with high accuracy so that a detailed placement and routing process can thereafter quickly optimize placement and routing of components forming the partitions.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
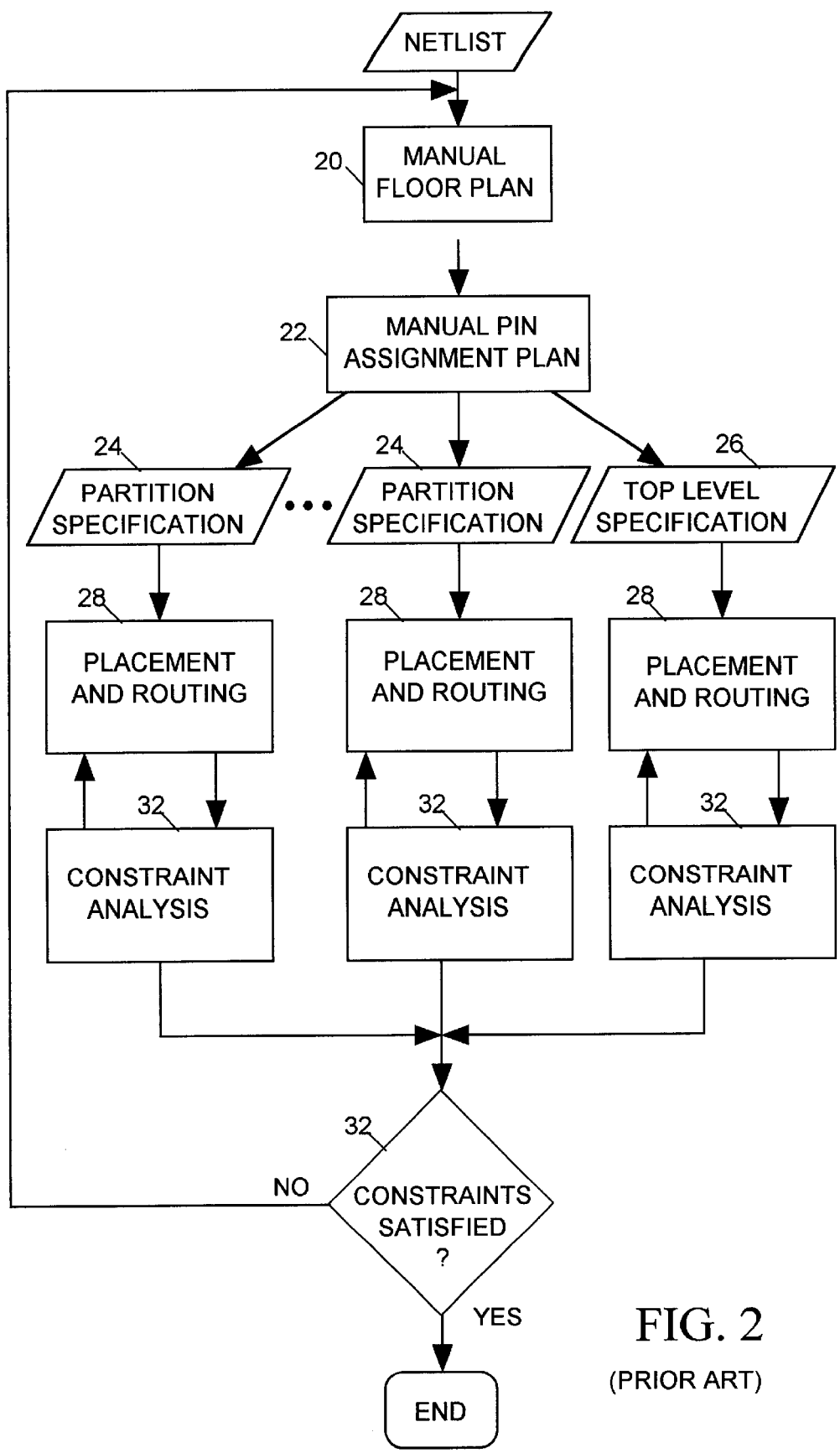
Figure 3:
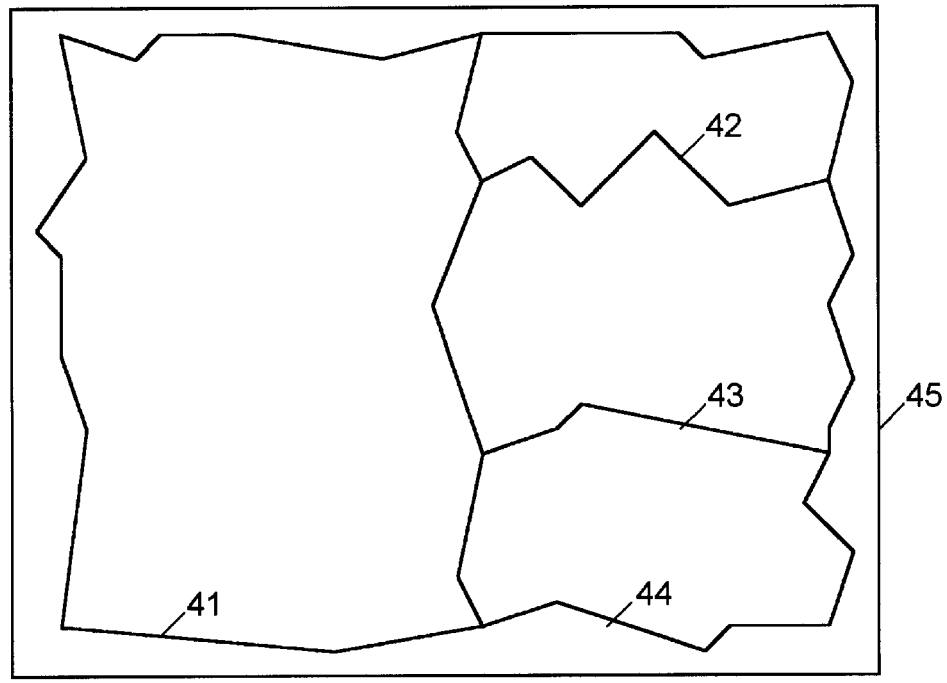
Figure 4:
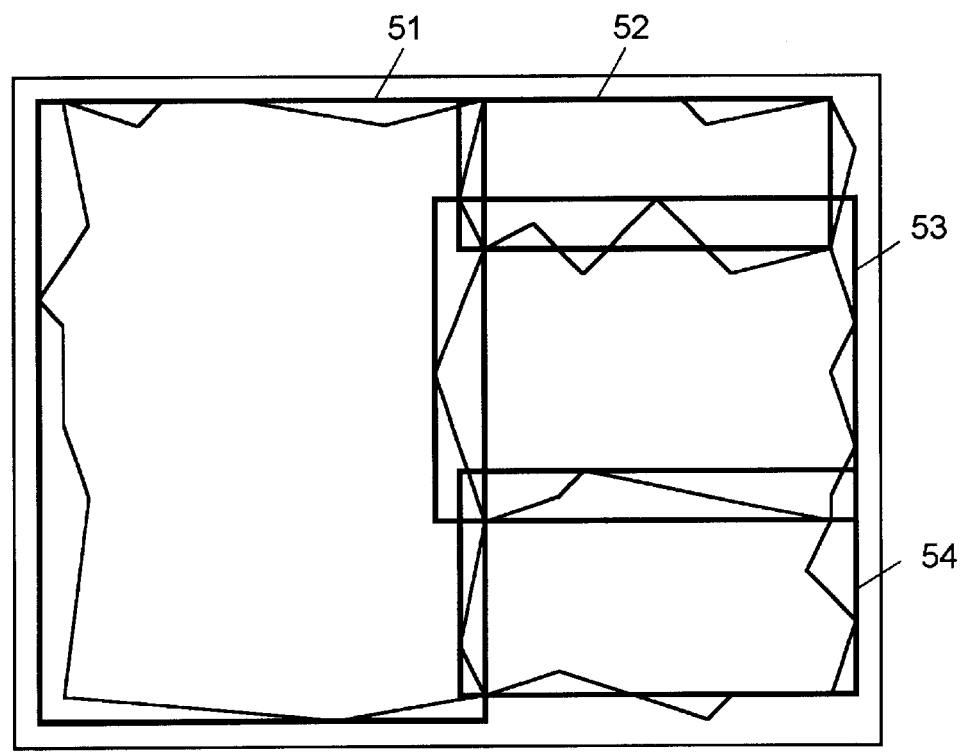
Figure 5:
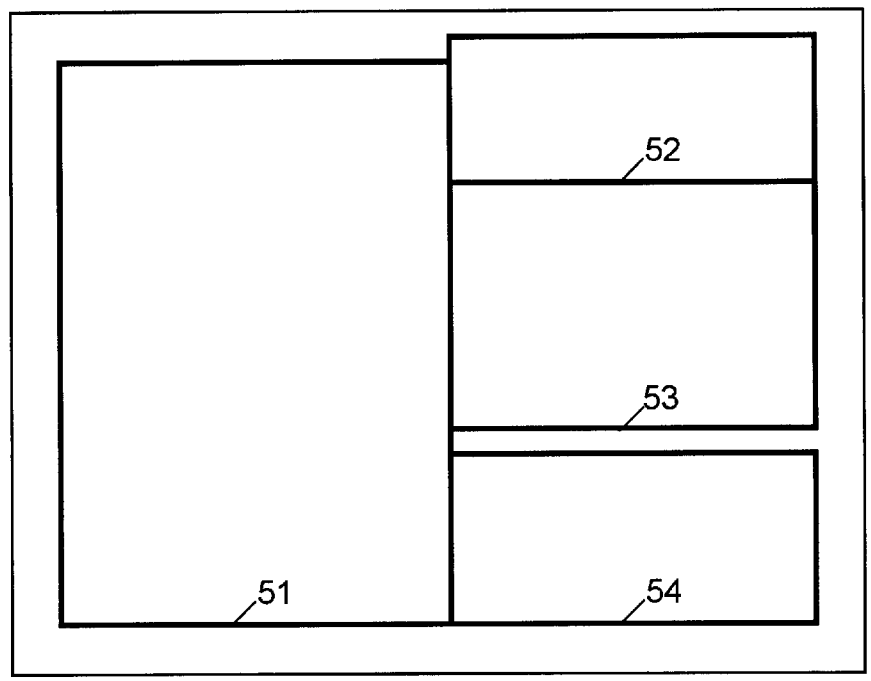
Figure 6:
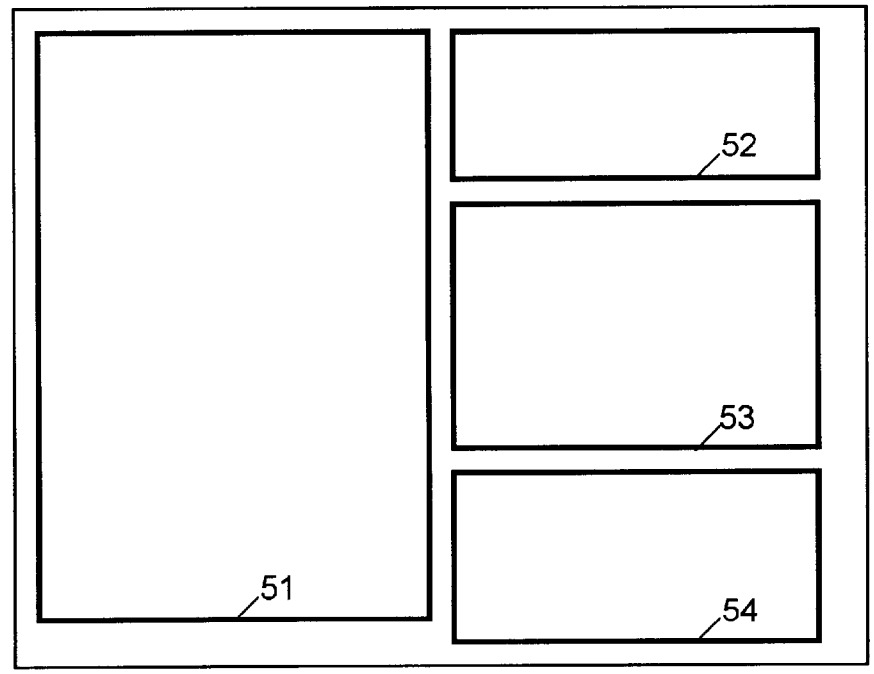
Figure 7:
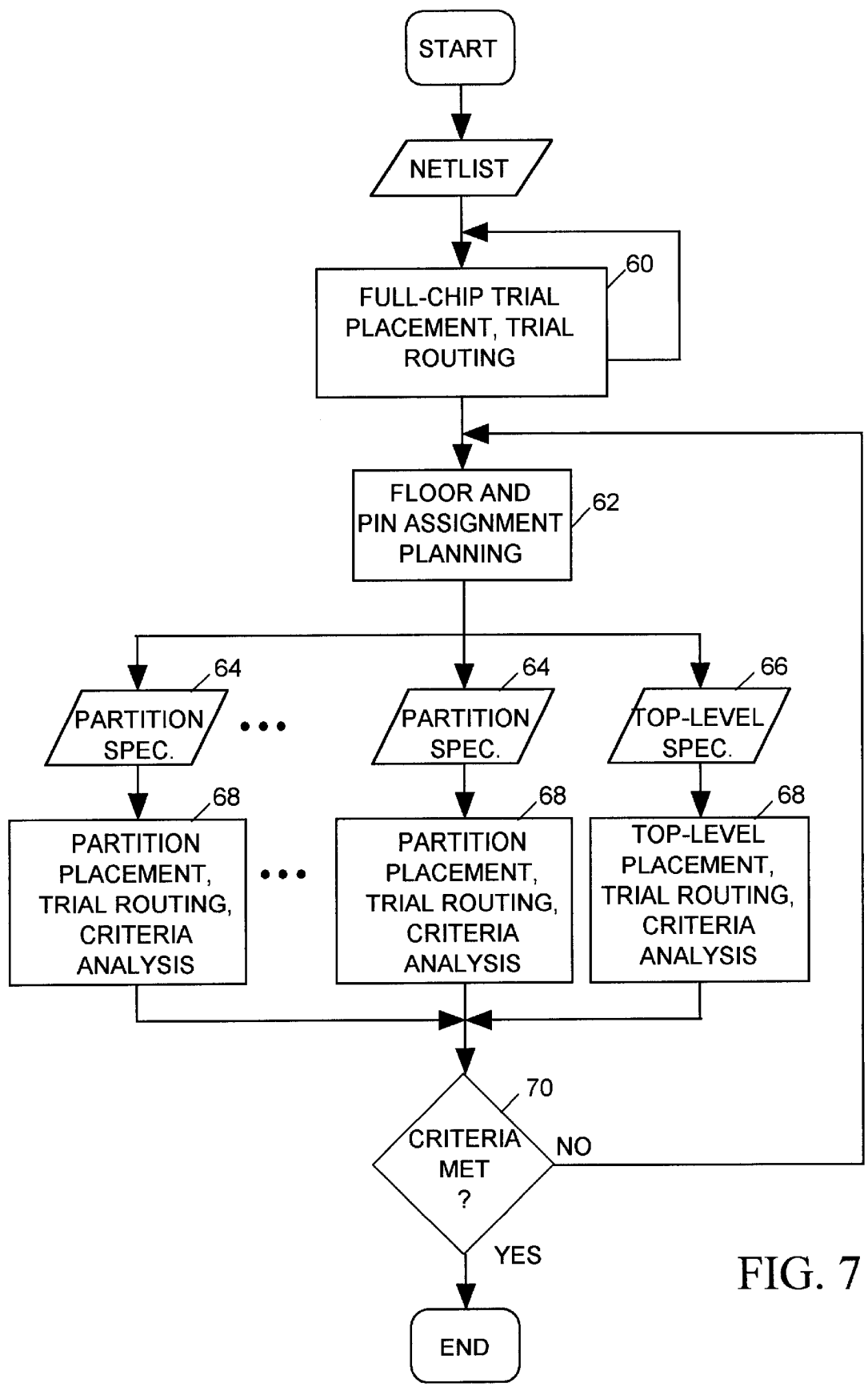
Figure 8:
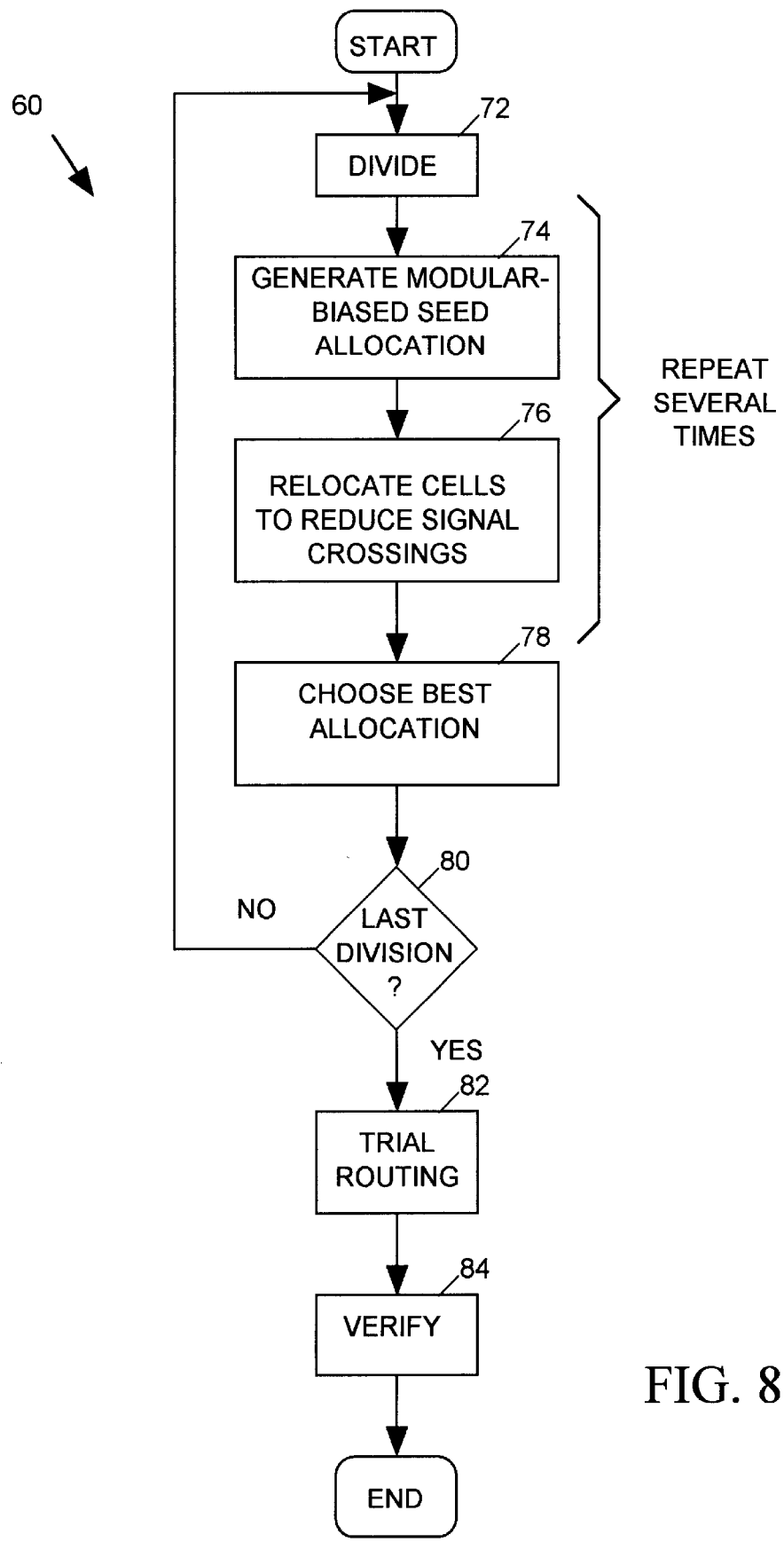

FIG. 1 illustrates in block diagram form an example of prior art hierarchical logic design of a central processing unit, FIG. 2 is a flowchart illustrating a typical prior art method of establishing placement and routing of cells in the substrate area of an integrated circuit (IC) chip, FIG. 3 is a simplified plan view of an IC substrate outlining four module core areas encompassing cells forming four logic modules of a circuit, FIG. 4 is a plan view the IC substrate generally similar to FIG. 3 except that a set of four rectilinear boxes are superimposed over the four module core areas, FIG. 5 is a plan view of the IC substrate generally similar to FIG. 4 except that the four boxes are resized, FIG. 6 is a plan view of the IC substrate generally similar to FIG. 5 except that the four boxes are relocated, FIG. 7 is a flowchart illustrating an IC placement and routing method in accordance with the invention, and FIG. 8 is a flowchart illustrating the trial placement and routing step of FIG. 7 in greater detail.

DESCRIPTION OF THE PREFERRED EMBODIMENT(S)

Modular Circuit Design

A placement and routing system in accordance with the invention processes a netlist or similar model of a circuit to determine a suitable layout for circuit components within an integrated circuit (IC) substrate. A netlist typically models an IC as a hierarchy of circuit modules wherein each higher level module is formed by lower level modules. FIG. 1 illustrates in block diagram form an example of a prior art hierarchical logic design of a central processing unit (CPU) 10 formed by several high level modules including for example an instruction unit (IUNIT) 11, an execution unit (EUNIT) 12, and a cache controller 13. Each high level module 11–13 is formed by several lower level modules 14 which in turn are formed by still lower level modules 15. Small circuit cells 16 such as logic gates and individual transistors form modules residing at the lowest levels of the hierarchy. The placement and routing system automatically divides the design into several "partitions", each including one or more modules and then places and routes the cells forming each partition in separate rectilinear areas of the substrate. The invention relates in particular to how the system chooses the appropriate size, shape and position of each area of the substrate that is to contain a partition.

Divide-and-Conquer Placement

When designing an IC, an IC design engineer initially creates a high-level model of the IC using a hardware description language (HDL) to describe the logic of the various circuit modules and the manner in which those modules interact. After using a simulator to verify circuit logic, the design engineer usually employs computer-aided design (CAD) tools to convert the high level HDL circuit model into the lower-level, technology specific, netlist model wherein module behavior is based on models of the actual cells (logic gates, transistors, etc.) that are to implement the actual circuit. The design engineer can then use simulation and timing verification tools to process the netlist to verify circuit logic and timing. The design engineer is then ready to begin designing the physical layout and interconnection of circuit components within the IC substrate area with the aid of computer-aided placement and routing tools.

A typical prior art system uses a "divide-and-conquer" placement algorithm when placing cells. A divide-and-conquer algorithm successively subdivides the substrate area of an IC into progressively smaller substrate partitions. (Note that in this context the term "partition" applies to partitions of an IC substrate rather than to partitions, collections of modules, of a circuit design.) Whenever a larger substrate partition is subdivided into two (or more) smaller substrate partitions, the algorithm allocates cells of the larger partition between the smaller partitions in a way that minimizes the number of signal paths crossing substrate partition lines. Since there are an enormous number of ways a large number of cells can be allocated between two or more substrate partitions, various heuristic search techniques are used to improve the way cells are allocated between partitions. A typical prior art divide-and-conquer system will initially randomly allocate cells of a substrate partition between its sub-partitions and then try relocating individual cells from one sub-partition to another to find an allocation producing the fewest number of signal crossings.

When the IC substrate has been divided into a large number of small substrate partitions, positions of the cells are fixed and a "trial routing" algorithm estimates the timing characteristics of signal paths needed to appropriately interconnect the cells. The design engineer may then use various CAD tools to again verify the logic and timing of the IC layout. Problems in timing uncovered by timing analysis are resolved by iteratively adjusting component placement or trial routing.

When the system has found a placement and trial routing satisfying timing and other circuit criteria, the design engineer uses additional CAD tools to establish a detailed routing plan for the IC specifying the actual paths of conductors interconnecting circuit cells. The logic and timing of the circuit are then verified once again based on the detailed routing plan which provides a more accurate estimate of signal path timing than the trial routing. Any detected problems in signal timing are again resolved by iteratively adjusting detailed routing or, when necessary, by adjusting component placement. When a satisfactory placement and detailed routing plan has been established, the IC is ready for fabrication, and the placement and routing plan is converted into specifications for the masks used to fabricate the IC.

Design Partitioning

Since a conventional divide-an-conquer placement and routing process does not attempt to group cells according to their logic modules, cells of separate modules end up being intermingled to some extent on the IC substrate, particularly where there are many connections between cells of differing modules. However when laying out an IC design engineers often like to restrict selected circuit modules to specific areas of the IC substrate to make it easy to later change those module without affecting the placement and routing of other modules. Thus a design engineer will often divide the design into several "circuit partitions", each of which may be independently placed and routed as if they were separate IC designs being placed in smaller substrate areas. (Note again that the term "circuit partition" as used in this context differs from the "substrate partitions" that a divide-and-conquer placement system creates.) In the example of FIG. 1, a design engineer may decide that the higher level modules 11–13 should be implemented in separate circuit partitions. The circuit partitions themselves are then suitably placed and interconnected on one large IC. Since the design partitions can be concurrently placed and routed by several placement and routing systems operating in parallel, design engineers will also partition a large IC design simply to speed up the placement and routing process, It may also be necessary to partition a large circuit design to keep the size of the circuit to be placed and routed within the capability of a placement and routing system.

FIG. 2 is a flowchart illustrating a typical prior art system for establishing IC placement and routing where a design is to be partitioned. Starting with the netlist for the full IC, a design engineer manually establishes a "floor plan" (step 20) for the IC specifying the size, shape and position in the IC placement area of each circuit partition. The design engineer typically estimates the size (area) of each circuit partition based the size and number of transistors and other components forming the design modules to be included in the circuit partition, and on the number and nature of the signal paths between those components. The design engineer must also choose the shape and position of each circuit partition specified in the floor plan. However since the netlist does not include much information on which to base a decision as to appropriate shape and positioning of each circuit partition, the design engineer often must rely largely on experience to make educated guesses.

Having developed a floor plan, the design engineer then checks the netlist to determine which signals pass in and out of each circuit partition and manually assigns various locations ("pins") around the boundary of each partition at which partition input and output signals are to enter and exit each partition (step 22). The netlist, floor plan and pin assignment plan are then converted into a set of specifications 24, one for each circuit partition, and a "top level" specification 26. Each partition specification 26 includes a netlist for the modules included in the partition along with data defining various constraints the partition must satisfy including the size and shape of substrate area in which the partition is to be restricted, pin assignments, timing and other constraints. The top level specification 26 defines the size, shape and pin assignment for all partitions.

The design engineer then provides the partition specifications 24 as inputs to separate automated placement and routing systems (steps 28) which then try to optimize the internal placement and routing of each partition without altering its size or shape or its pin assignments. The top level specification may also be applied as input to placement and routing system which tries to optimize the positioning of and routing between the partitions, also without altering the size, shape or pin assignments of the partitions.

The placement and routing process is typically iterative in nature, with placement and routing schemes being repeatedly modified and tested to determine how well they satisfy constraints (steps 32). The placement and routing process ends by selecting a placement and routing scheme that best satisfies all constraints (step 34).

Since the initial floor and pin assignment plans established at steps 20 and 22 were established in large part by "educated guesswork", they may not lead to placement and routing plans satisfying all constraints. The design engineer must therefore respond to a failure at step 32 by returning to steps 20 and 22 and modifying the floor and pin assignment plans. Thus the development of acceptable floor and pin assignment plans is often an iterative process, with the design engineer modifying the floor and pin assignment plans many times before the system is able to converge on a placement and routing scheme satisfying all circuit constraints. The problem with this conventional approach is that since, in a large IC, the automated placement and routing process (steps 28–32) can be time-consuming, several iterations of the process can take a long time.

The speed and efficiency with which the prior art system illustrated in FIG. 2 arrives at an acceptable placement and routing plan, as well as the efficiency with which the process uses IC real estate, depends to a great extent on the adequacy of floor and pin assignment plans the design engineer provides at steps 20 and 22. Although a design engineer can estimate the area needed for each partition based on the number and size of transistors and other components forming the module and on the number of connections between them, such an estimate is not always accurate. When partition space requirements are overestimated, IC floor space is wasted. When space requirements are underestimated, the placement and routing process will fail.

Improved Placement and Routing System

As discussed above, a design engineer typically develops floor and pin assignment plans based on information included in the netlist and "educated guesses" when a circuit design is to be partitioned. Therefore it would be beneficial to provide a way to make better floor and pin assignment plans at the beginning of the process so that the process will more rapidly converge to an acceptable placement and routing plan.

A placement and routing system in accordance with the present invention automatically establishes floor and pin assignment plans for an IC based on an initial "whole-chip" trial placement that initially treats the IC design as if it were not partitioned. The system uses a modified version of a conventional divide-and-conquer placement system to create the trial placement in a way that is biased towards clustering cells of each design module near one another in the IC substrate. This helps to minimize the amount of intermingling of cells of differing modules within the IC substrate area.

After creating a trial placement, the system determines the outlines of areas within the trial placement containing cells forming each module. Since the size, shape and relative position of these "module core areas" are indicative of a suitable size, shape and relative positions of circuit modules, the system can then create a floor plan defining an appropriate size, shape and relative positioning of circuit partitions that are to incorporate those modules based on the dimensions and relative positions of the module core areas. The system also performs a trial routing for the trial placement to determine points at which signals pass through the boundaries of each partition, and uses that information to create a suitable pin assignment plan.

The system then separately performs a detailed internal routing and placement for each circuit partition to optimize placement and routing criteria for the modules included in each partition. The system also performs a top level routing and placement to optimize the placement of the partitions within the IC substrate and to optimize partition interconnects. Since the system bases the floor and pin assignment plans on the trial placement and routing, rather than by "guesswork", the resulting detailed placement and routing is more likely to successfully fit each partition into its assigned rectilinear substrate area, to make more efficient use of IC real estate and to better satisfy timing and other criteria.

FIG. 3 illustrates in simplified form the results of a whole-chip trial placement of a circuit design that is to be divided into four circuit partitions. Four areas 41–44 of an IC substrate 45 encompass cells of the modules that are to form the four partitions. (While in this simplified view the four areas do not overlap, in practice they will often overlap since interconnected cells of differing partitions will typically intermingle to some extent at the area borders.) After identifying the boundaries of the four areas 41–44, the placement system determines the X,Y coordinates of the smallest size rectilinear boxes 51–54 (FIG. 4) that can contain each identified area. The system then reduces the size of each box 51–54 without changing its shape and without changing the position of its centroid so that the total area covered by each box 51–54 is approximately the same as that of its corresponding modular core area 41–44 as illustrated in FIG. 5. As illustrated in FIG. 6, boxes 51–54 are then repositioned within substrate area 45 and proportionately resized to the extent needed to reduce overlaps and to provide a desired minimal spacing between the boxes. The resulting boxes 51–54 thereafter define sizes, aspect ratios and preliminary positions of the areas reserved for the four circuit partitions.

The original full-chip level placement and routing is then discarded and a new detailed placement and routing process is then separately carried out for each partition in which cell placement within the partition is restricted to an area indicated by the floor plan and is constrained to terminating signals at its boundaries in accordance the pin assignment plan.

Placement and Routing Process

FIG. 7 illustrates in flowchart form the steps of a placement and routing process in accordance with the invention. As mentioned above, the system is used when an IC is to be partitioned. The system begins by performing an iterative, full-chip trial placement and routing (step 60) which searches for a placement and routing that best meets timing and other circuit criteria. The system then establishes floor and pin assignment plans based on the trial placement and routing in the manner described above (step 62). The system then produces a specification 64 for each circuit partition, as well as a top level specification 66. Each partition specification 64 includes a netlist for the modules to be included in the circuit partition, defines size and shape of the substrate area in which the circuit partition is to be placed, includes the partition's pin assignments, and defines various timing and other constraints that the partition's placement and routing are to satisfy. The top-level specification 66 indicates the size, shape and pin assignments of each partition, the dimensions of the IC substrate in which the partitions may be placed, and various timing and other constraints on the placement and interconnection of the partitions.

The partition and top level specifications 64 and 66 provide inputs to separate automated placement and routing tools (steps 68) that produce detailed internal placement and routing plans for each partition and at the top level. The placement and routing tools may try several different placement and routing plans to find a layout that best meets the timing and other circuit criteria defined in the partition or top-level specification 64 or 66. Note that the placement and trial routing process for each module (steps 68), as well as the top level placement and trial routing process can be carried out independently and concurrently.

If all circuit criteria are met (step 70) then the layout process ends. If a layout meeting timing and other criteria cannot be found at steps 68, then the process returns to step 62 to allow the design engineer to make adjustments to the floor plan or the pin assignment. By basing the initial floor plan and the pin assignment plan on a preliminary full chip trial placement and routing, rather than on estimates based on the netlist and guesswork, the layout process is likely to coverage more quickly on an acceptable layout and is likely to produce a better, more efficient IC layout.

FIG. 8 illustrates the full-chip trial placement and routing step 60 of FIG. 7 in more detailed flow chart form. The system initially divides the substrate area into two partitions (step 72) and then allocates cells of the circuit to those two partitions (step 74) to create a "seed allocation". In accordance with the invention, the seed allocation splits at most one module at the highest possible level of the hierarchical design when allocating cells between the two substrate partitions. The seed allocation is then iteratively modified by relocating cells between the two substrate partitions to search for an allocation that reduces the number of signal paths crossing substrate boundaries (step 76). Steps 74 and 74 are repeated several times with a different seed allocation being produced at step 74 during each iteration, thereby searching for an allocation having a relatively low number of signals passing between the two substrate partitions. However in all cases the seed allocation allocates cells of at most only a single circuit modules to more than one substrate partitions. When the system relocates cells from one partition to another at step 76 to reduce the number signal paths crossing partition boundaries, it does so without regard to the module to which the cells being relocated belong. Hence cells of a module can become less tightly clustered when helpful to minimize signal path lengths. However since the seed allocation made at step 60 is biased toward initially placing cells along modular lines, the final allocation is more likely to result in tight clustering of cells of given module than when the seed allocation is done randomly, as in prior art divide-and-conquer systems.

The allocation providing the fewest signal crossings between partitions is then selected (step 78). If the substrate has not yet been divided to its smallest limit, (step 80) then the process returns to step 72 to further subdivide the existing substrate partitions into smaller partitions and to find a suitable allocation of cells between the new smaller partitions (steps 74–78) that is similarly biased toward cluster cells of each circuit module. When the substrate area has been divided into its smallest partitions (step 80), a trial routing plan is established (82) using conventional trial routing algorithms, and the circuit logic and timing is verified (step 84). The resulting trial placement and routing then provides input to the floor and pin assignment planning step (step 62) of FIG. 7.

Thus has been shown and described an integrated circuit partitioning, placement and routing system in accordance with the invention that automatically generates a floor plan and a pin assignment plan based on a whole-chip trial placement and trial routing. This enables the size, shape and pin assignments of each partition to be accurately estimated in the context of an actual placement of the cells of the partition within the entire circuit. Floor and pin assignment plans based on trial placement and routing are therefore typically better predictors of the size, shape and interconnection requirements of each circuit partition than floor and pin assignment plans based solely on netlist information and educated guesswork on the part of the circuit designer. Therefore such floor and pin assignment plans help an iterative placement and routing system to converge more quickly on an acceptable IC layout, and helps to produce more efficient IC layouts better meeting circuit criteria.

While the forgoing specification has described preferred embodiment(s) of the present invention, one skilled in the art may make many modifications to the preferred embodiment without departing from the invention in its broader aspects. For example, while for simplicity the partition areas 51–54 that are defined in the floor plan are shown in FIG. 6 as being rectangular, such areas may also be of a non-rectangular, rectilinear shape closely approximating the shape of the modular core areas 41–44 (FIG. 3) from which they were derived or which includes or circumvents "hard fence" areas containing cells or modules of fixed shape. The appended claims therefore are intended to cover all such modifications as fall within the true scope and spirit of the invention.

What is claimed is:

1. A method for determining placement of cells within an integrated circuit (IC) substrate to form a circuit, said circuit being described by a model as a plurality of modules formed by said cells, the method comprising the steps of:

a. processing said model to generate a trial placement assigning each of said cells to a separate position within said IC substrate;

b. processing said trial placement to generate a floor plan of said substrate specifying dimensions of a particular substrate area that is to contain all cells of a subset of said plurality of modules; and c. re-assigning all cells of said subset to positions within said particular substrate area, and re-assigning all other cells forming said circuit to positions within said IC substrate outside said particular area.

2. The method in accordance with claim 1 wherein said model comprises a netlist description of said circuit.

3. The method in accordance with claim 1 wherein said particular substrate area specified at step b is rectilinear in shape.

4. The method in accordance with claim 1 wherein step b comprises the substeps of:

b1. processing said trial placement to identify a module core area of said trial placement encompassing cells forming said subset of modules; and b2. generating said floor plan wherein said dimensions of said particular substrate area are determined as a function of dimensions of said module core area identified at step b1.

5. The method in accordance with claim 4 wherein said floor plan also specifies a trial position within said substrate of said particular substrate area, said trial position being determined in response to a position of said module core area within said trial placement.

6. The method in accordance with claim 4 wherein said particular substrate area is substantially rectilinear and wherein said module core area is other than substantially rectilinear.

7. The method in accordance with claim 1 wherein step a comprises the substeps of:

a1. defining partitions of said substrate;

a2. processing said model to determine which of said cells form each of said plurality of modules; and a3. assigning each cell of said circuit to a separate position within said substrate such that cells of not more than one of said modules are assigned to separate ones of said partitions.

8. The method in accordance with claim 7 wherein step a further comprises the substeps of:

a4. defining sub-partitions of one of said partitions defined at step a1; and a5. reassigning each cell assigned to a position within said one of said partitions to a position within one of said sub-partitions such that cells of not more than one of said modules are assigned to separate ones of said sub-partitions.

9. The method in accordance with claim 1 wherein step c comprises the substeps of:
   c1. adjusting a position within said substrate of said particular substrate area; and
   c2. re-assigning all cells of said substrate to separate positions within said substrate outside of said particular substrate area, and re-assigning all cells forming said particular module to separate positions within said particular substrate area.

10. The method in accordance with claim 9 wherein substeps c1 and c2 are carried out concurrently.

11. The method in accordance with claim 1 wherein step b comprises the substeps of:
    b1. processing said trial placement and said model to identify dimensions of a module core area of said trial placement encompassing cells of said particular subset; and
    b2. generating said floor plan wherein said dimensions of said particular substrate area are determined based on dimensions of said module core area identified at step b1, said floor plan also specifying a trial position within said substrate of said particular substrate area based on a position of said module core area within said trial placement;
    wherein said particular substrate area is substantially rectilinear; and
    wherein said module core area is other than substantially rectilinear.

12. The method in accordance with claim 11 wherein step a comprises the substeps of:
    a1. defining partitions of said substrate;
    a2. processing said model to determine which of said cells form each of said plurality of modules; and
    a3. assigning each cell of said circuit to a separate position within said substrate such that cells of not more than one of said modules are assigned to separate ones of said partitions;
    a4. defining sub-partitions of one of said partitions defined at step a1; and
    a5. reassigning each cell assigned to a position within said one of said partitions to a position within one of said sub-partitions such that cells of not more than one of said modules are assigned to separate ones of said sub-partitions.

13. The method in accordance with claim 12 wherein step c comprises the substeps of:
    c1. processing said model and said floor plan to establish a position within said substrate of said particular area;
    c2. re-assigning all cells forming said circuit other than cells of said subset to separate positions within said substrate outside of said particular substrate area; and
    c3. assigning all cells forming said subset to separate positions within said particular substrate area.

14. A method for determining placement and interconnection of cells within an integrated circuit (IC) substrate to form a circuit described by a model as a plurality of modules formed by said cells, the method comprising the steps of:
    a. processing said model to generate a trial placement assigning each of said cells to a separate position within said IC substrate;
    b. processing said trial placement and said model to generate a trial routing specifying characteristics of interconnections between said cells forming said circuit;
    c. processing said model and said trial placement to generate a floor plan of said substrate specifying dimensions of a set of substrate areas, each corresponding to a separate subset of said modules;
    d. processing said trial placement and said floor plan to assign pin positions along boundaries of said substrate areas comprising points at which signals are to enter and depart said substrate areas;
    e. processing said model and said floor plan to re-assign each cell of each said subset of said modules to a position within a corresponding substrate area specified in step c; and
    f. specifying signal path connections between said cells forming said circuit consistent with said pin positions assigned at step d.

15. The method in accordance with claim 14 wherein each said substrate area specified by said floor plan is substantially rectilinear.

16. The method in accordance with claim 15 wherein step a comprises the substeps of:
    a1. defining partitions of said substrate;
    a2. processing said model to determine which of said cells form each of said plurality of modules; and
    a3. assigning each of said cells to a separate position within said substrate with cell assignments being biased toward clustering cells forming each module within a same one of the partitions of said substrate defined at step a1.

17. The method in accordance with claim 16 wherein step a further comprises the substeps of:
    a4. defining sub-partitions of one of said partitions defined at step a1; and
    a5. reassigning each cell assigned to a portion within said one of said partitions to a position within one of said sub-partitions with cell assignments being biased toward clustering cells of each module within a sane one of said sub-partitions.

18. The method in accordance with claim 14 wherein step c comprises the substeps of:
    c1. processing said model and said trial placement to identify dimensions of module core areas of said trial placement that encompass cells forming said separate subsets of said modules; and
    c2. generating said floor plan wherein dimensions of said set of substrate areas are derived from said dimensions of said module core areas identified at step c1.

19. The method in accordance with claim 18 wherein said floor plan also specifies initial positions within said substrate of said set substrate areas, wherein said initial positions are derived from positions of said module core areas within said trial placement.

20. The method in accordance with claim 18 wherein said substrate areas are substantially rectilinear and wherein said module core area is other than substantially rectilinear.

21. A method for determining placement of cells within an integrated circuit (IC) substrate where the cells form a circuit modeled by a netlist as hierarchy of modules formed by the cells, the method comprising the steps of:
    a. processing the netlist to generate a trial placement assigning each cell to a separate position within the IC substrate with cell assignments being biased to cluster cells of each module together;
    b. analyzing the trial placement to identify module core areas of the IC substrate encompassing cells forming said circuit modules;

c. organizing said model into a set of partitions, each including a separate subset of said modules;

d. creating a floor plan of said IC substrate defining dimensions of a set of rectilinear areas of said substrate, each corresponding to a separate one of said partitions, wherein the rectilinear areas are sized and positioned in the floor plan relative to sizes and positions of module core areas within the trial placement; and e. re-assigning all cells of each subset of said modules to positions within a corresponding one of said rectilinear areas.

22. A method for determining positions of cells included in each of a set of partitions of a circuit design within an integrated circuit substrate, the method comprising the steps of:

generating a trial placement of cells implementing said circuit design that ignores partitioning of the circuit design such that cells included in separate partitions are intermingled in the trial placement;

preparing a floor plan for placing cells forming each partition in a separate area of said substrate, said separate area for each partition being sized in proportion to an area within said trial placement that contains the cells included in that partition; and separately determining positions of cells forming each of said partitions within said separate areas defined in said floor plan.

23. The method in accordance with claim 22 further comprising the steps of:

performing a trial routing of cells placed by said trial placement;

preparing a pin assignment plan for said separate areas in a manner guided by said trial routing; and preparing a routing plan for said cells forming each of said partitions the routing plan being consistent with said pin assignment plan.

* * * * *